United States Patent
Sahasrabudhe et al.

(10) Patent No.: US 9,659,908 B1
(45) Date of Patent: May 23, 2017

(54) SYSTEMS AND METHODS FOR PACKAGE ON PACKAGE THROUGH MOLD INTERCONNECTS

(71) Applicant: Intel Corporation, Santa Clara, CA (US)

(72) Inventors: Shubhada H. Sahasrabudhe, Gilbert, AZ (US); Sandeep B Sane, Chandler, AZ (US); Siddarth Kumar, Chandler, AZ (US); Shalabh Tandon, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/937,022

(22) Filed: Nov. 10, 2015

(51) Int. Cl.
*H01L 25/065* (2006.01)
*H01L 23/31* (2006.01)
(Continued)

(52) U.S. Cl.
CPC ........ *H01L 25/0657* (2013.01); *H01L 21/565* (2013.01); *H01L 23/3107* (2013.01); *H01L 24/17* (2013.01); *H01L 24/81* (2013.01); *H01L 25/50* (2013.01); *H01L 2224/1607* (2013.01); *H01L 2224/16055* (2013.01); *H01L 2224/16057* (2013.01); *H01L 2224/16145* (2013.01);
(Continued)

(58) Field of Classification Search
CPC ....... H01L 25/065; H01L 23/31; H01L 23/00; H01L 25/00; H01L 21/56
See application file for complete search history.

(56) References Cited

U.S. PATENT DOCUMENTS

2005/0040540 A1* 2/2005 Haba ............... H01L 24/11
257/778
2010/0304530 A1* 12/2010 Yim ............... H01L 23/04
438/109

(Continued)

FOREIGN PATENT DOCUMENTS

| KR | 1020090012933 A | 2/2009 |
| KR | 1020120059795 A | 6/2012 |
| KR | 1020150049164 A | 5/2015 |

OTHER PUBLICATIONS

"International Application Serial No. PCT/US2016/053083, International Search Report received on Mar. 1, 2017", 3 pgs.

(Continued)

*Primary Examiner* — Peniel M Gumedzoe
(74) *Attorney, Agent, or Firm* — Schwegman Lundberg & Woessner, P.A.

(57) ABSTRACT

Discussed generally herein are methods and devices for more reliable Package on Package (PoP) Through Mold Interconnects (TMIs). A device can include a first die package including a first conductive pad on or at least partially in the first die package, a dielectric mold material on the first die package, the mold material including a hole therethrough at least partially exposing the pad, a second die package including a second conductive pad on or at least partially in the second die package the second die package on the mold material such that the second conductive pad faces the first conductive pad through the hole, and a shape memory structure in the hole and forming a portion of a solder column electrical connection between the first die package and the second die package.

20 Claims, 8 Drawing Sheets

(51) Int. Cl.
*H01L 23/00* (2006.01)
*H01L 25/00* (2006.01)
*H01L 21/56* (2006.01)

(52) U.S. Cl.
CPC ............... *H01L 2224/81193* (2013.01); *H01L 2224/81365* (2013.01); *H01L 2224/81815* (2013.01); *H01L 2224/81951* (2013.01); *H01L 2225/06513* (2013.01); *H01L 2225/06527* (2013.01)

(56) References Cited

U.S. PATENT DOCUMENTS

| | | |
|---|---|---|
| 2011/0018115 A1 | 1/2011 | Takahashi |
| 2013/0234317 A1 | 9/2013 | Chen et al. |
| 2014/0264910 A1* | 9/2014 | Razdan ............... H01L 25/0657 257/774 |

OTHER PUBLICATIONS

"International Application Serial No. PCT/US2016/053083, Written Opinion received on Mar. 1, 2017", 6 pgs.

* cited by examiner

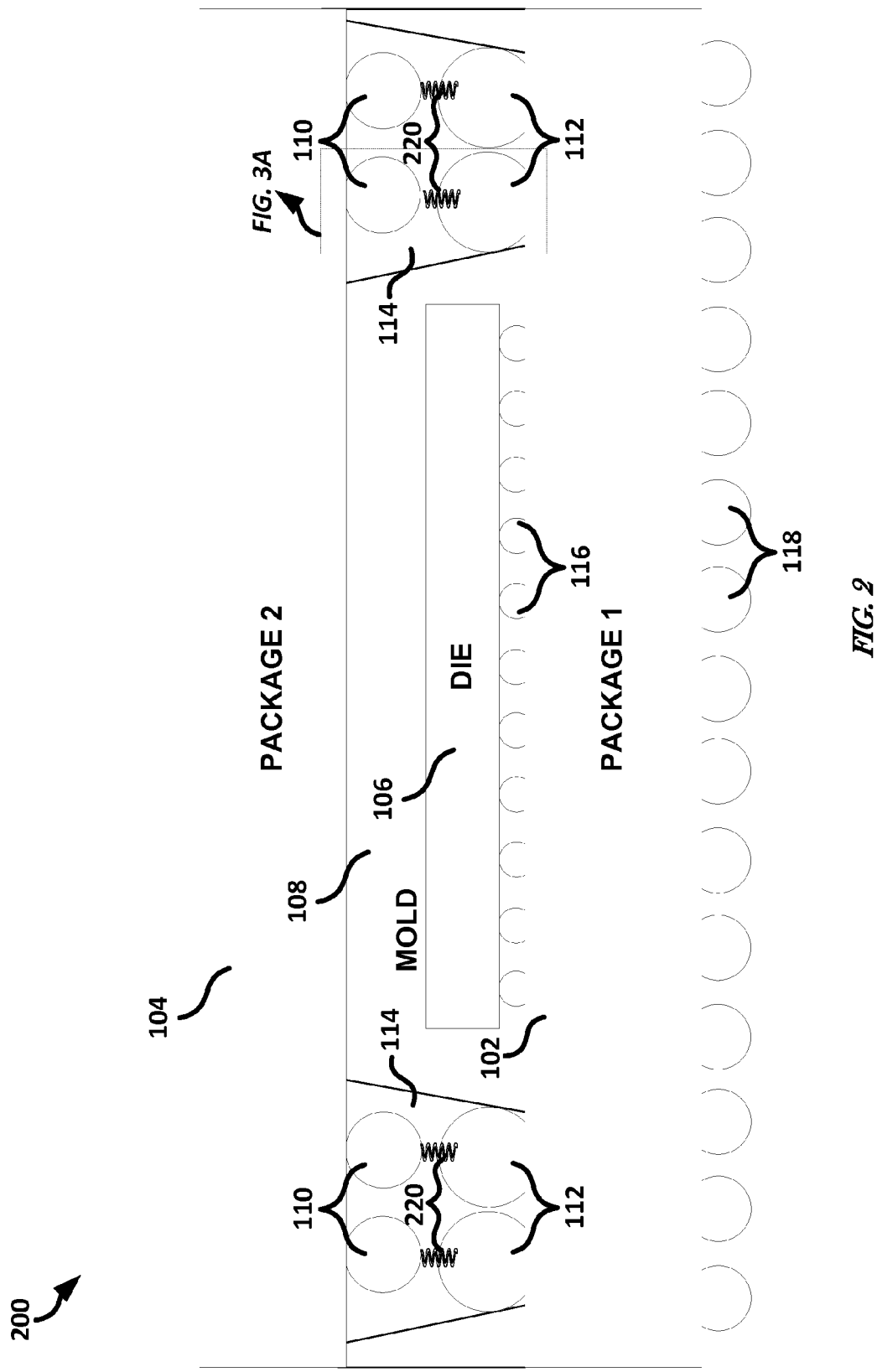

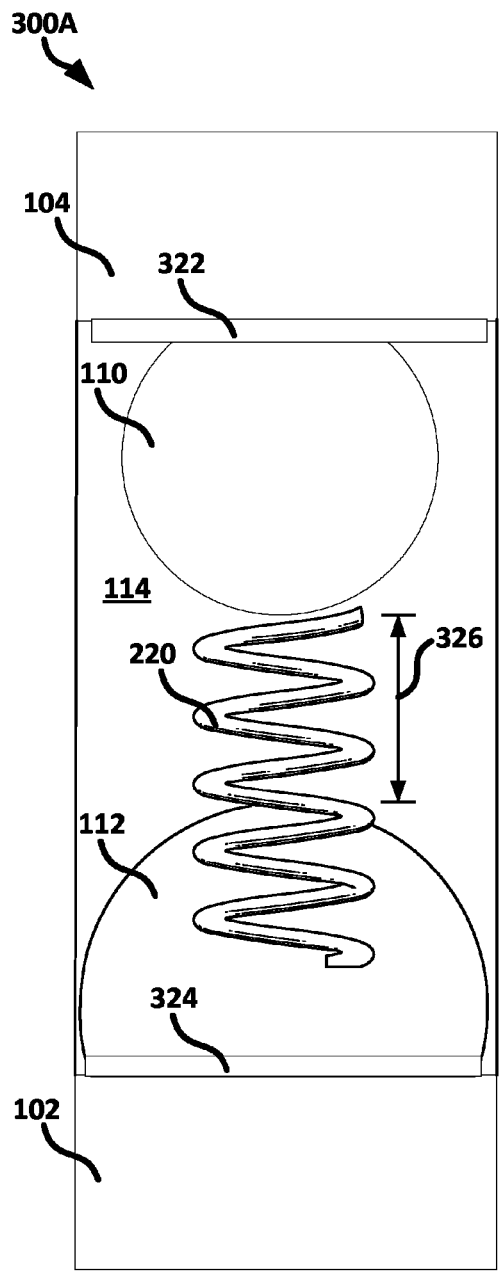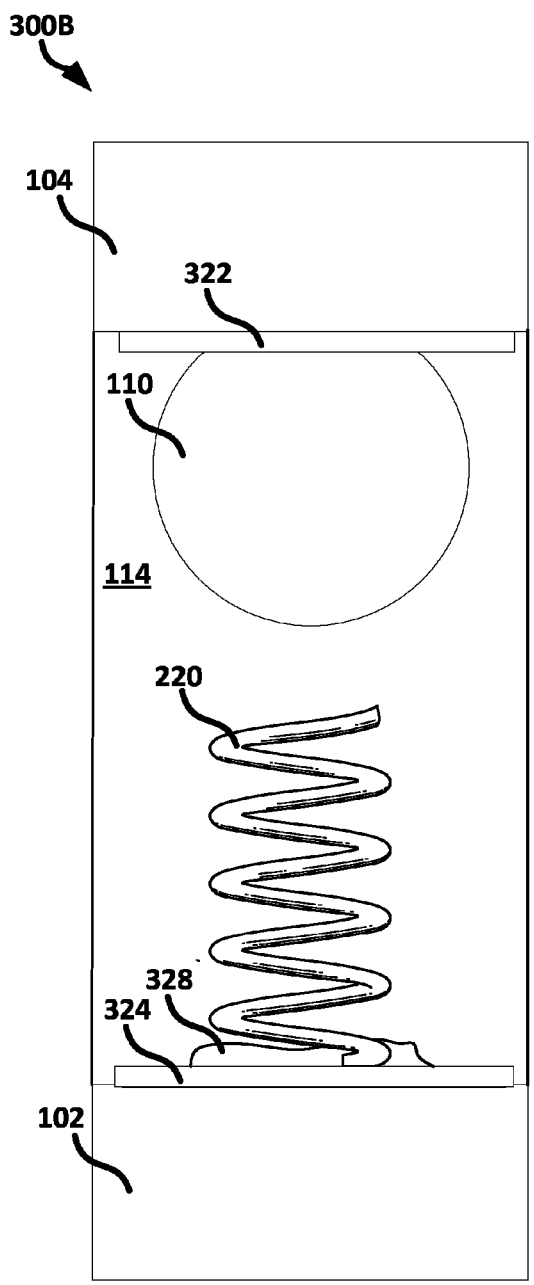
*FIG. 3A*
*FIG. 3B*

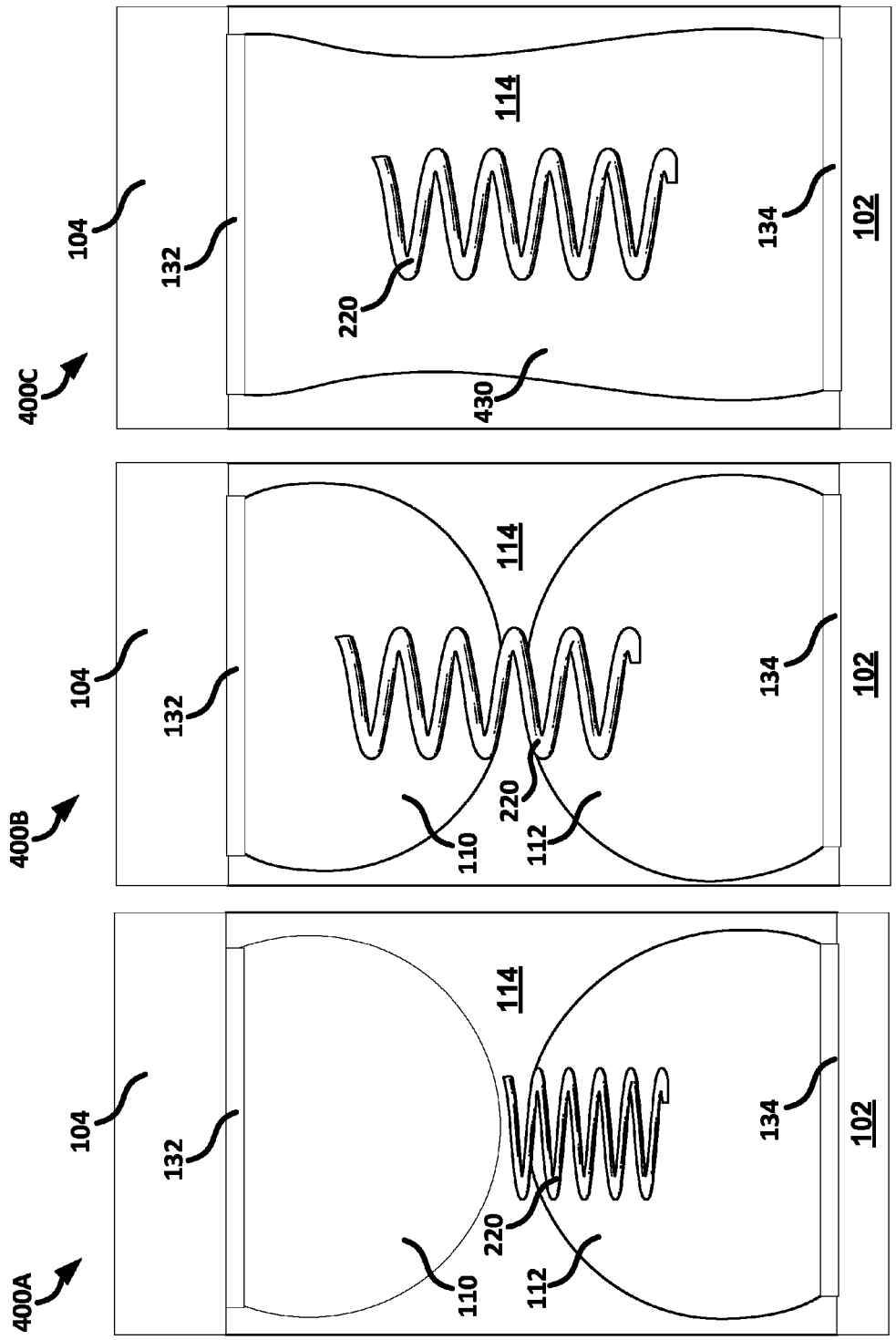

SYSTEMS AND METHODS FOR PACKAGE ON PACKAGE THROUGH MOLD INTERCONNECTS

TECHNICAL FIELD

This disclosure relates generally to semiconductor packaging that includes one or more Package-on-Package (PoP) through mold interconnects (TMI). More specifically, one or more embodiments can include a shape memory structure situated in a TMI hole to help ensure electrical contact between packages in a PoP TMI.

BACKGROUND ART

Package-on-Package (PoP) is a technology that can be used to stack a first die package on a second die package. In some instances, the one die package is a memory package and the other die package is a logic die package. Package flatness properties of a surface of the first and second die packages can impact product yield, such as can be due to Through Mold Interconnect (TMI) failure. In instances that include a second die package that includes a surface mount technology (SMT) interconnect for mounting on the first die package, yield depends upon a shape of the first die package, the second die package, as well as the alignment between the two packages during a reflow process. Some common failure modes are ball bridging, non-contact opens (NCO), and head-on-pillow (HOP) failure Thinner form-factor packaging increases a challenge provided by warpage, further impacting the device assembly manufacturing processes and the corresponding product yield. The thinner packaging has a smaller bump pitch, thus reducing product yield and increasing product cost. Existing solutions to address one or more of these electrical interconnect issues includes addition of flux in TMI through holes to help with NCO and HOP failures. Although the flux solution helps improve yield, the flux only helps when the gap between the PoP packages is less than fifteen micrometers.

BRIEF DESCRIPTION OF THE DRAWINGS

FIG. 2 illustrates, by way of example, a block diagram of an embodiment of a PoP package that includes a shape memory structure to help reduce ball bridging, NCO, and/or HOP failures.

FIG. 3A illustrates, by way of example, an exploded view diagram of a shape memory structure situated on a ball in a TMI through hole of a PoP package.

FIG. 3B illustrates, by way of example, an exploded view diagram of a shape memory structure situated on a pad in a TMI through hole of a PoP package.

FIGS. 4A, 4B, and 4C illustrate, by way of example, block diagrams of an embodiment of a process for forming an electrical connection between packages of a PoP package using a shape memory structure.

DESCRIPTION OF THE EMBODIMENTS

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Embodiments discussed herein use a shape memory structure (e.g., a spring, pin, or other shape memory structure that expands when sufficiently heated) to help overcome warpage, misalignment, or other issues in creating a PoP package that includes a Through Mold Interconnect (TMI). In one or more embodiments, the shape memory structure includes a shape memory alloy (SMA) material. An SMA material includes a combination of materials, such as can include two or more of nickel, titanium, silver, cadmium, copper, aluminum, tin, iron, zinc, silicon, platinum, manganese, cobalt, gallium, niobium, hafnium, and palladium. One common SMA material is nitinol, which is a combination of nickel and titanium.

Displacement between solder balls in a through hole in a dielectric mold material is controlled in a manner using the shape memory structure. The shape memory structure increases the chance of a good solder joint formation, such as to form a reliable electrical connection between packages of a PoP package. The shape memory structure effectively reduces the displacement between one or more solder balls in the mold material through hole of the PoP package. The shape memory structure is situated on, or at least partially in, a solder ball or on a package pad. The shape memory structure can provide a path for reflowed solder to join. In embodiments, the shape memory structure can automatically stretch to its memory shape, such as by being heated as a natural byproduct of a reflow process. The shape memory structure (e.g., the stretched spring, straightened pin, or other longer shape memory structure) acts as a molten solder wick that aids in creating a reliable electrical interconnect. The shape memory structure being compliant, such as with a controlled elastic constant, can help compensate for a range of gaps between packages of the PoP package, thus decreasing yield losses from connection failures. This SMA incorporation can be accomplished in at least two different ways, such as can include attaching the shape memory structure on a solder ball and attaching the shape memory structure on a pad attached to the package, as is discussed in more detail herein.

Figure 1:
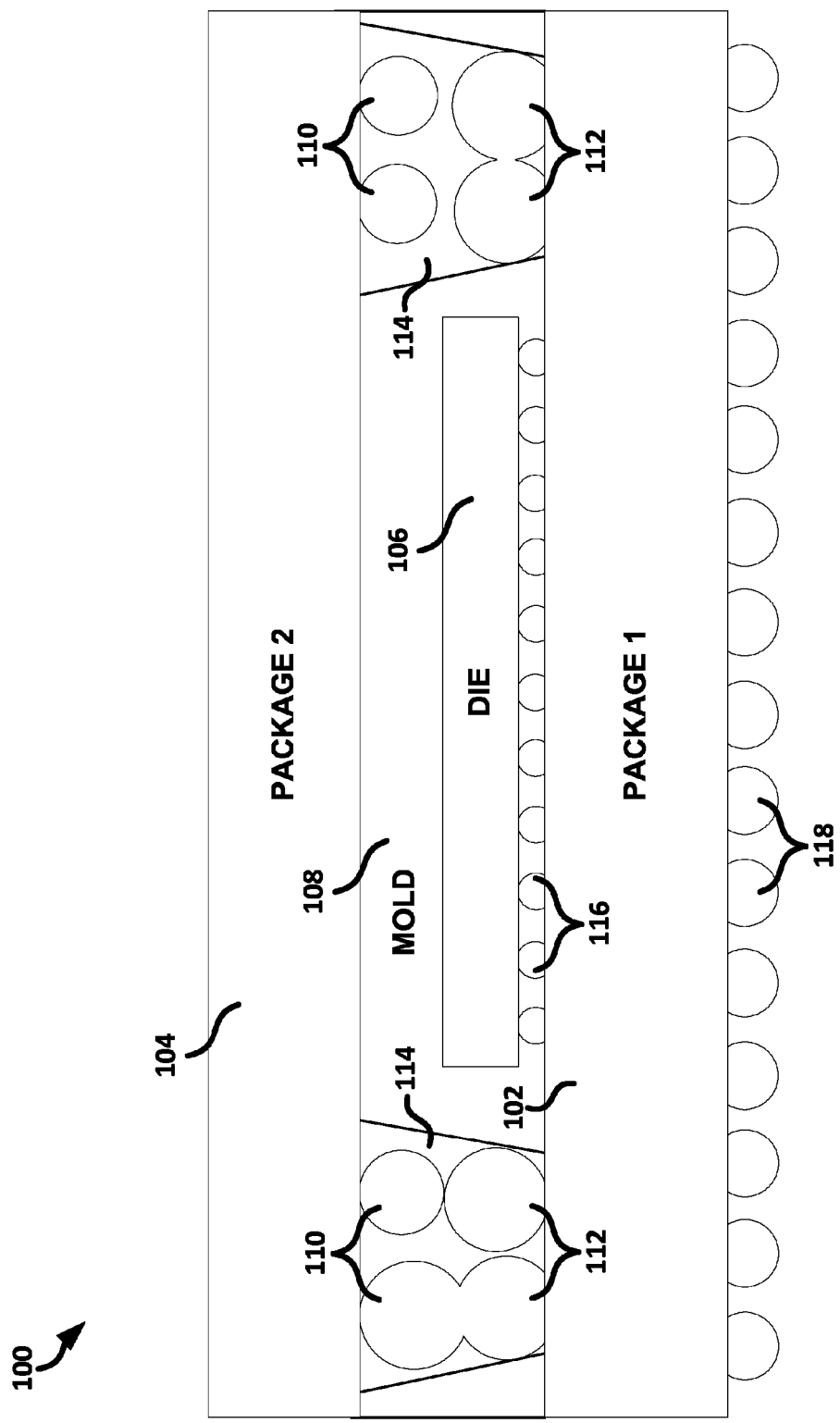
FIG. 1 illustrates, by way of example, a block diagram of an embodiment of a PoP package with ball bridging, NCO, and HOP failures.

FIG. 1 illustrates, by way of example, a block diagram of an embodiment of a PoP package 100 with ball bridging, NCO, and HOP failures. The PoP package 100 includes a first die package 102 and a second die package 104 on the first die package, with a mold material 108 separating the die packages 102 and 104. In one or more embodiments, the first die package 102 can include a die 106 attached to pads on a surface thereof.

The first die package 102 as illustrated includes solder balls 112 attached to a surface thereof and the second die package 104 includes mating solder balls 110 attached to a surface that faces the surface of the first die package 102 that include the solder balls 112 attached thereto. The die 106 is connected to the first die package 102 through solder balls 116. The first die package 102 can be connected to a printed circuit board, or other electrical substrate with contact pads through solder balls 118.

The mold material 108 as illustrated includes a plurality of through holes 114 extending all the way through the mold material 108 to a pad and/or surface of the first die package 102. The solder connections between the first and the second die packages 102 and 104 are formed in the holes 114 between pairs of aligned solder balls 110 and 112. The solder balls 110 and 112 (from bottom to top) of FIG. 1 are illustrated as forming a reliable electrical connection, a HOP connection (a weak, unreliable connection), an open, and two of the solder balls 112 are bridged.

FIG. 2 illustrates, by way of example, a block diagram of an embodiment of a PoP package 200 that includes shape memory structures 220 to help reduce ball bridging, NCO, and/or HOP failures. The package 200 is illustrated prior to a reflow process being performed to melt the solder balls 110 and 112 and form a solder column (a reliable TMI). The shape memory structures 220 of FIG. 2 are illustrated as being partially in the solder balls 112. In one or more other embodiments, one or more of the shape memory structures 220 can be attached to pads on a surface of the first die package 102. In such embodiments, the solder balls 112 may be unnecessary and not used in the formation of a PoP TMI electrical connection. Embodiments in which the shape memory structure 220 is attached to the solder ball 112 and attached to the pad on the surface of the first die package 102 are discussed in turn.

FIG. 3A illustrates, by way of example, an exploded view diagram of a shape memory structure 220 situated partially in a solder ball 112 in a TMI through hole 114 of a PoP package 300A. FIG. 3A is an exploded view diagram of a portion of the package 200 of FIG. 2 outlined with a dashed box labelled "FIG. 3A".

The package 300A as illustrated includes the first and second die packages 102 and 104, the solder balls 110 and 112 in the through hole 114 in the mold material 108 (mold not shown in FIG. 3A), and the shape memory structure 220 attached to the solder ball 112. The first die package 102 includes a conductive contact pad 324 attached thereto and facing a corresponding contact conductive pad 322 on, or at least partially in, the second die package 104, The shape memory structure 220 reduces a gap (indicated by the arrows 326) which solder from the solder balls 110 and 112 would need to traverse to create a reliable electrical connection during a reflow process. The shape memory structure 220 can act as a wick for the solder from the solder balls 110 and 112 to flow together and form a reliable electrical connection. More details regarding creating an electrical connection using a shape memory structure attached to a solder ball, such as depicted in FIG. 3A, are provided with regard to FIGS. 4A, 4B, 4C, and 5.

FIG. 3B illustrates, by way of example, an exploded view diagram of a shape memory structure 220 attached to a pad 324 in a TMI through hole 114 of a PoP package 300B. FIG. 3B is an exploded view diagram, similar to FIG. 3A, with FIG. 3B illustrating the shape memory structure 220 attached directly to the pad 324 instead of the solder ball 112.

The package 300B as illustrated includes the first and second die packages 102 and 104, the solder ball 110 in the through hole 114 in the mold material 108 (mold not shown in FIG. 3B), and the shape memory structure 220 attached to the pad 324. The shape memory structure 220 can be attached to the pad 324 using a conductive adhesive 328, such as solder, curable conductive paste, a conductive tape, or other conductive adhesive. The first die package 102 includes a conductive contact pad 324 attached thereto and facing a corresponding contact conductive pad 322 on, or at least partially in, the second die package 104. The spring 220 takes the place of the solder ball 112 and reduces a gap (indicated by the arrows 326 in FIG. 3A) which solder from the solder balls 110 and 112 would need to traverse to create a reliable electrical connection during a reflow process. The shape memory structure 220 can act as a wick for the solder from the solder ball 110 to flow to the pad 324 and/or the conductive adhesive 328 and form a reliable electrical connection. More details regarding creating an electrical connection using a spring attached to a pad, such as depicted in FIG. 3B, are provided with regard to FIGS. 6A, 6B, 6C, and 7.

In one or more embodiments, the shape memory structure 220 is electrically conductive, such as to help current to flow from one die package to another die package. In such embodiments, a reliable electrical connection can be made between the first die package 102 and the second die package 104 even if solder from the balls 110 and/or 112 do not reach the other solder ball or the opposing pad 324 or 322. A reliable electrical connection can be formed through solder from the solder ball 110 contacting the spring 220, such as without contacting the solder of the solder ball 112, the conductive adhesive 328, or the pad 324. In such embodiments, the shape memory structure 220 provides a path through which electrical current can flow between the die packages 102 and 104.

FIGS. 4A, 4B, and 4C illustrate, by way of example, block diagrams of an embodiment of a process for forming an electrical connection between packages of a PoP package using a shape memory structure. Each of the FIGS. 4A-4C illustrate PoP packages 400A, 400B, and 400C, respectively, at various stages of an electrical connection formation process. The packages 400A-C each include a first die package 102, a second die package 104, pads 132 and 134 on respective die packages 104 and 102, and a shape memory structure 220.

The package 400A including the shape memory structure 220 attached to and partially embedded in the solder ball 112 attached to the pad 134. The solder balls 110 and 112 and the shape memory structure 220 are situated in a mold through hole 114. FIG. 4B illustrates the device 400B that includes the device 400A after the shape memory structure 220 and solder ball 110 have been heated. Heating the shape memory structure 220 causes the spring to morph into a shape that has been "programmed" into the spring 220. Heating the shape memory structure 220 and the solder balls 110 and 112 can be done during a solder reflow process.

With shape memory materials, a shape is programmed into the material by heating the material, forming the material into the desired (programmed) shape, and then cooling the material. In the cooled state the material can be formed into a different shape. Then, when sufficient heat is applied to the material, the material returns to its programmed shape. Thus, in the example of FIGS. 4A-C, the shape memory structure 220 as shown in FIGS. 4B-C is in its programmed state and the shape memory structure 220 as shown in FIG. 4A is in a deformed, cooled state.

The temperatures at which the solder flows and the shape memory structure 220 returns to its programmed shape need to be controlled so that the shape memory structure 220 does not fall to the pad 134 when or the shape memory structure 220 needs to become sufficiently long so as to make contact with solder of the solder ball 110. Such temperatures are solder material and spring material dependent and can be determined by evaluating a specification regarding the solder material or shape memory structure material, experimenting with the solder material and/or shape memory structure material, and/or contacting a solder material and/or shape memory structure material manufacturer.

FIG. 4C illustrates a device 400C that includes the device 400B after the solders from the respective solder balls 110 and 112 have become molten and flowed together, by way of being wicked by the shape memory structure 220, to form a solder column 430. The solder column 430 forms a contiguous pathway for electrical current to flow between the pads 132 and 134, and thus between the packages 102 and 104.

Figure 5:
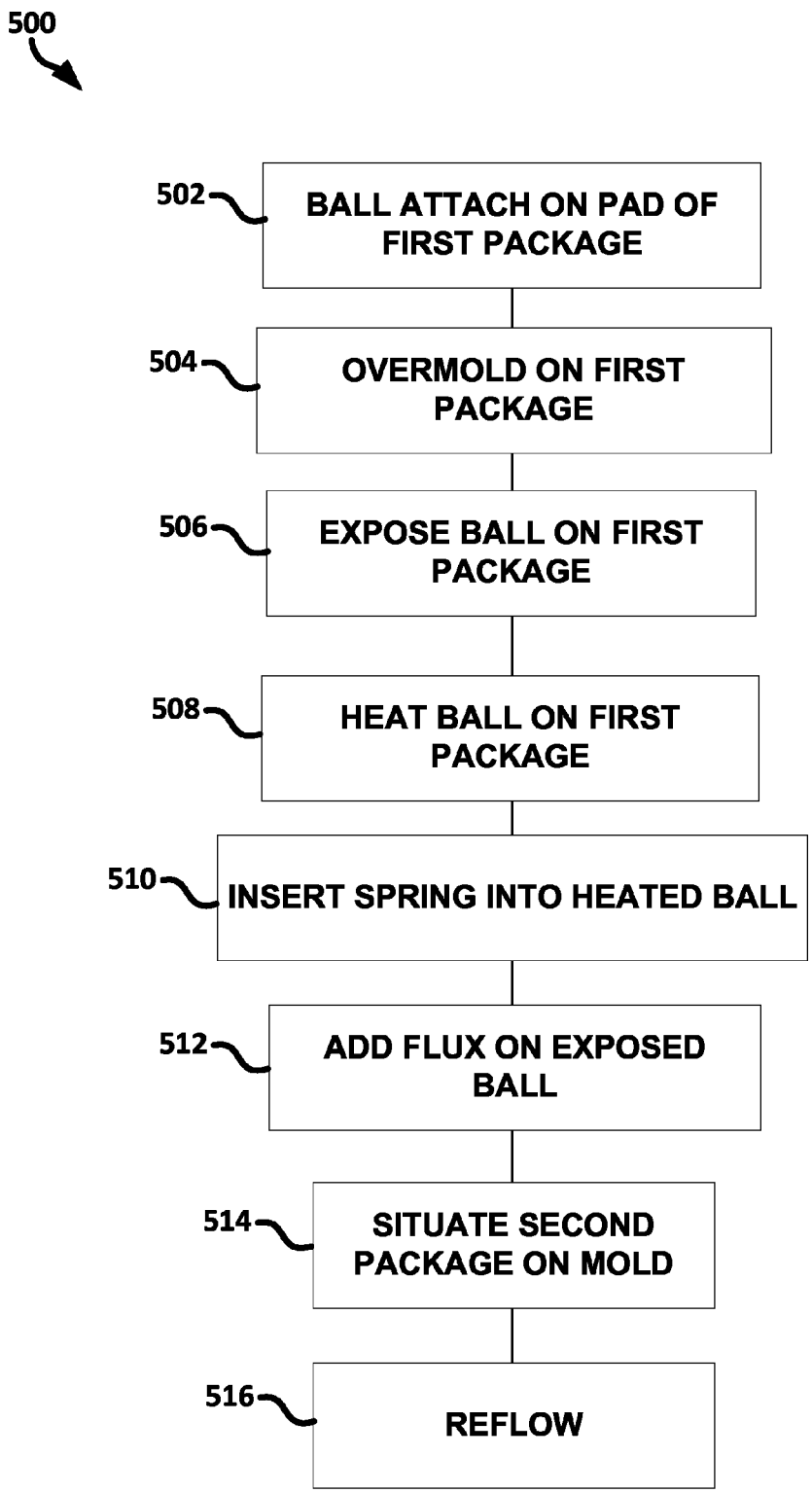
FIG. 5 illustrates, by way of example, an embodiment of a method for forming an electrical connection between packages of a PoP package using a shape memory structure.

FIG. 5 illustrates, by way of example, an embodiment of a method 500 for forming an electrical connection between packages of a PoP package using a shape memory structure. The method 500 as illustrated includes: attaching a solder ball on a first die package, at operation 502; situating a mold material on the first die package, at operation 504; exposing the solder ball attached to the first die package, at operation 506; heating the exposed solder ball on the first die package, at operation 508; at least partially inserting a shape memory structure into the heated solder ball, at operation 510; optionally adding flux to the exposed ball and/or the inserted shape memory structure, at operation 512; situating a second die package on the mold material (such that a solder ball attached to the second die package is aligned with the shape memory structure and in a hole that exposes the solder ball attached to the first die package), at operation 514; and reflowing the package so as to join solder of the two solder balls and form a solder column, at operation 516.

The operation 506 can include drilling (e.g., laser of mechanical drilling), chemical etching, or other method of removing mold material on the solder ball, such as to expose the solder ball. The operation 510 can include inserting the shape memory structure to a depth sufficient to not interfere with the operation 514 and still allow the shape memory structure to contact a solder ball on the second die package when sufficiently heated. If the shape memory structure is not deep enough into the solder ball, the shape memory structure will make contact with the solder ball attached to the second package during operation 514 and create alignment issues. The operation 516 generally includes preheating the solder and spring to make a temporary connection between the shape memory structure and the solder ball attached to the second die package, such as to align the first and second die packages relative to each other, heating the solder and the shape memory structure to make the solder molten and expand the shape memory structure to its programmed shape, and then cooling the newly formed solder column electrical connection to permanently join the two solder balls and solidify the shape memory structure, at least partially, into the solder column, such as shown in FIG. 4C.

Figure 6C:
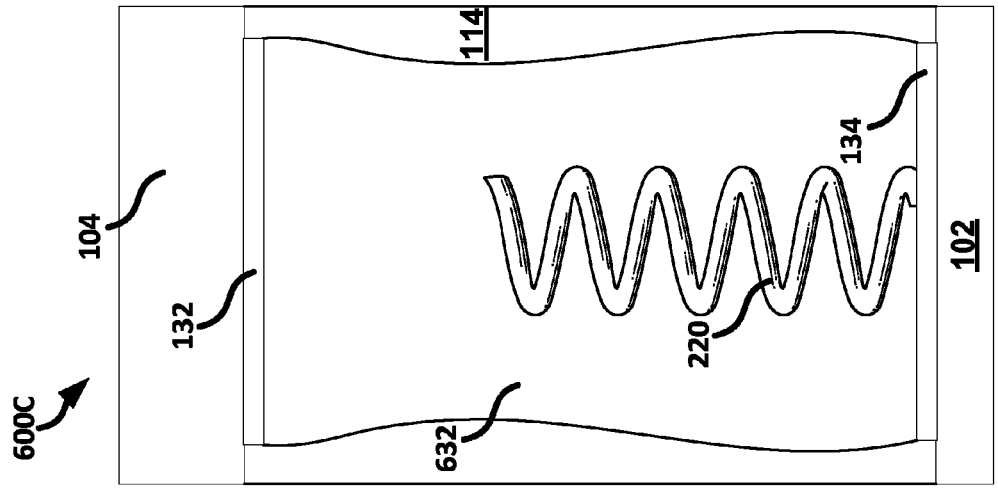
FIGS. 6A, 6B, and 6C illustrate, by way of example, block diagrams of another embodiment of a process for forming an electrical connection between packages of a PoP package using a shape memory structure.
Figure 6B:
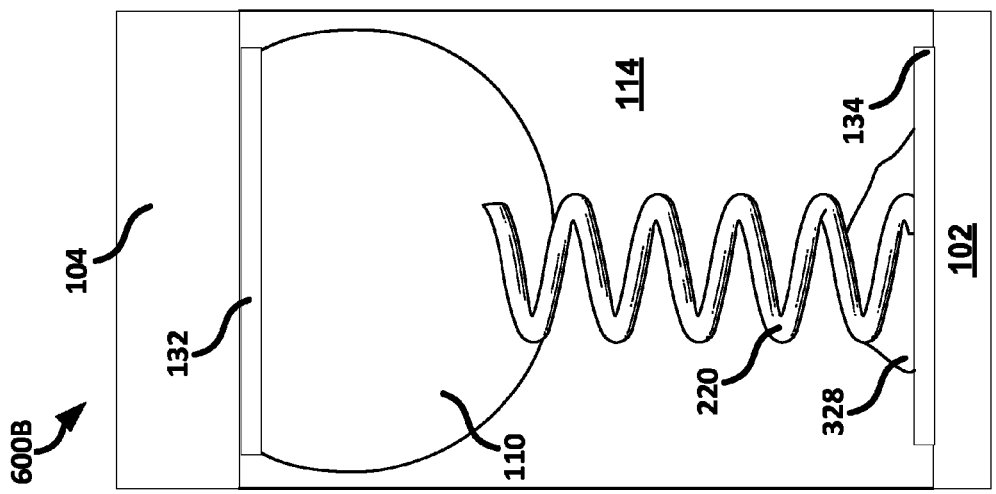
Figure 6A:
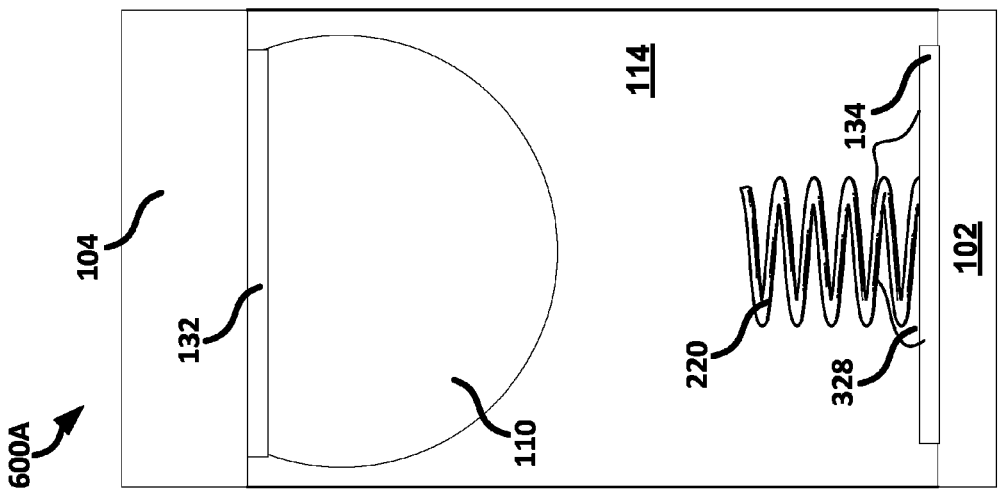

FIGS. 6A, 6B, and 6C illustrate, by way of example, block diagrams of another embodiment of a process for forming an electrical connection between packages 102 and 104 of a PoP package 600A, 600B, and 600C, respectively, using a shape memory structure 220, such as a spring, pin, or other shape memory structure that can reduce a gap between electrical contacts (e.g., pad(s) and/or solder ball (s)) when heated. Each of the FIGS. 6A-6C illustrate PoP packages 600A, 600B, and 600C, respectively, at various stages of an electrical connection formation process. The packages 600A-C each include a first die package 102, a second die package 104, pads 132 and 134 on respective die packages 104 and 102, and a shape memory structure 220.

The package 600A includes the shape memory structure 220 attached to the pad 134 using a conductive adhesive 328. FIG. 6B illustrates the package 600B that includes the package 600A after the shape memory structure 220 and solder ball 110 have been heated. Heating the shape memory structure 220 causes the spring to morph into a shape that has been "programmed" into the shape memory structure 220. Heating the shape memory structure 220 and the solder ball 110 can be done during a solder reflow process. In the examples of FIGS. 6A-C, the shape memory structure 220 as shown in FIGS. 6B-C is in its programmed state and the shape memory structure 220 as shown in FIG. 6A is in a deformed and/or cooled state.

The temperatures at which the solder of the solder ball 110 flows, the conductive adhesive 328 flows, and the shape memory structure 220 morphs to its programmed shape should be controlled so that the shape memory structure 220 does not fall over, or otherwise tilt, so as to help ensure that the shape memory structure 220 expands towards the solder ball 110 and does not create a bridge, NCO, or HOP failure. Such temperatures are solder material, conductive adhesive material, and spring material dependent and can be determined by evaluating a specification regarding the solder material or spring material, experimenting with the solder material and/or spring material, and/or contacting a solder material and/or spring material manufacturer.

FIG. 6C illustrates a device 600C that includes the package 600B after the solder from the solder ball 110 has become molten and flowed to the pad 134, by way of being wicked by the shape memory structure 220, to form a solder column 632. The solder column 632 forms a contiguous pathway for electrical current to flow between the pads 132 and 134, and thus between the packages 102 and 104.

Figure 7:
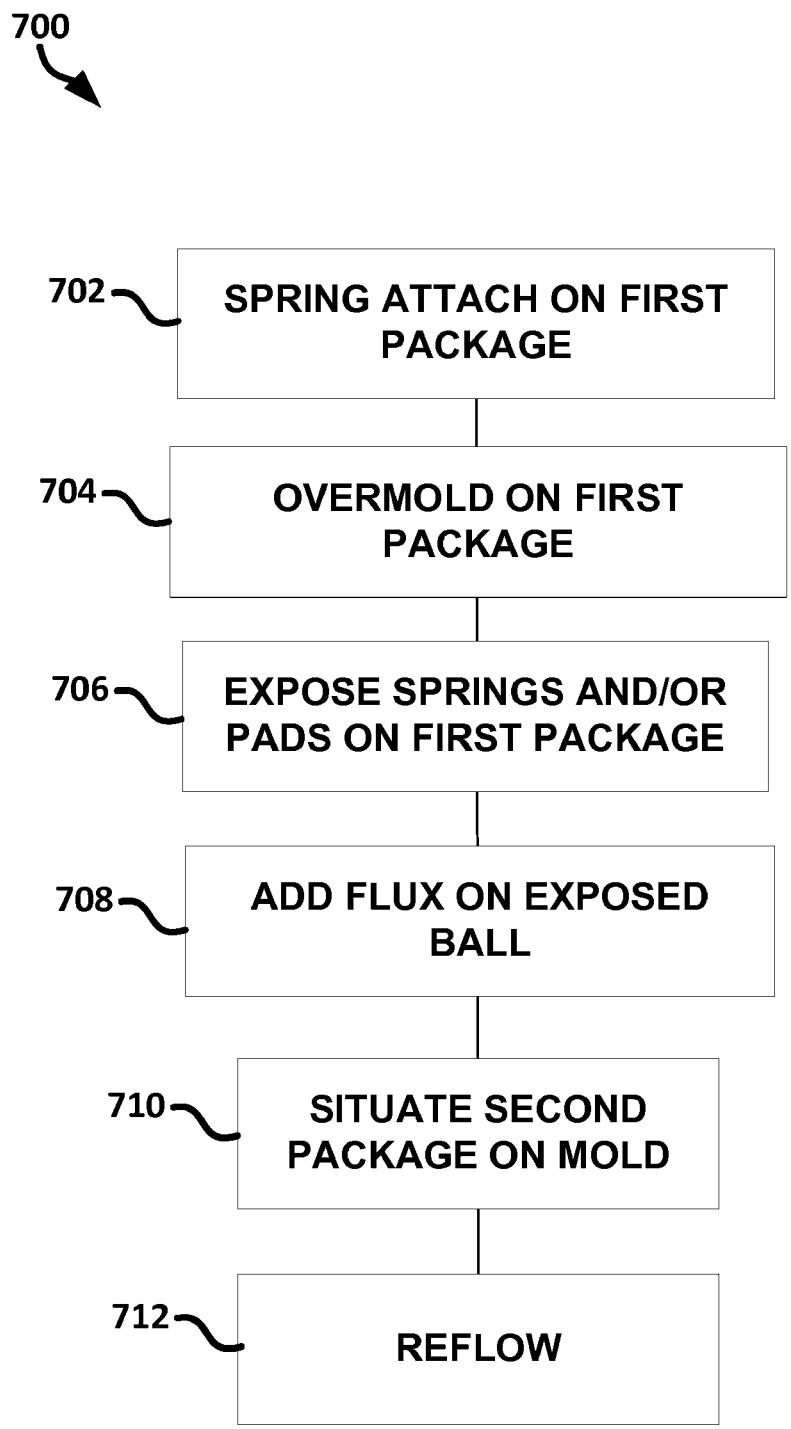
FIG. 7 illustrates, by way of example, an embodiment of a method for forming an electrical connection between packages of a PoP package using a shape memory structure.

FIG. 7 illustrates, by way of example, an embodiment of a method 700 for forming an electrical connection between packages of a PoP package using a spring. The method 700 as illustrated includes: attaching, (e.g., using a conductive adhesive) a shape memory structure on a pad attached to a first die package, at operation 702; situating a mold material on the first die package, at operation 704; exposing the shape memory structure (and at least a portion of the pad) attached to the pad attached to the first die package, at operation 706; optionally adding flux to the exposed ball and/or the inserted shape memory structure, at operation 708; situating a second die package on the mold material (such that a solder ball attached to the second die package is aligned with the shape memory structure and in a hole that exposes the solder ball attached to the first die package), at operation 710; and reflowing the package so as to form a solder column between a pad attached to the second die package and the pad attached to the first die package, at operation 712.

The operation 706 can include drilling (e.g., laser of mechanical drilling), chemical etching, or other method of removing mold material on the shape memory structure and/or the pad; such as to expose the shape memory structure and/or the pad. The operation 712 generally includes pre-heating the solder and shape memory structure to make a temporary connection between the shape memory structure and the solder ball attached to the second die package, such as to align the first and second die packages relative to each other, heating the solder and the shape memory structure to make the solder molten and lengthen the shape memory structure to its programmed shape, and then cooling the newly formed solder column electrical connection to permanently join the pads and solidify the shape memory structure into the solder column, such as shown in FIG. 7C.

While embodiments described herein illustrate the shape memory structure as a spring, other shapes can be used that are not considered springs. Other shapes that lengthen in the proper direction can be used. For example, a pin, spiral, helix, arch, question mark (without the dot), wave, or other shape that can lengthen into its programmed state can be used in place of a spring shaped shape memory structure. A spring shape can have advantages over other shapes, such as can include the spring shape may be compliant with a wider range of package shapes (e.g., warpage shapes). This is because a pin, for example, has a fixed dimension and may not work for a same range of package shapes as a spring, which has a wide range of length dimensions. A weight of the second package on the spring can limit the amount the spring expands in going into its programmed shape.

As long as the length of the shape memory structure is sufficient, the elastic nature (compressibility) of the shape memory structure allows it to adjust to any warpage shape, thus helping ensure a good TMI electrical connection. Embodiments discussed herein exploit the shape memory properties of SMA alloys, such as nitinol. At temperatures below an austenite phase transition temperature of the shape memory structure, the shape memory structure exhibits an elastic-plastic constitutive behavior (the martensite phase) the shape memory structure is in a contracted state at room temperature), however, heating the shape memory structure above the austenite temperature makes the shape memory structure revert to its "programmed" shape which happens to be longer than its length in its martensite in this application, thus aiding in the solder wicking process. The length, as used herein, refers to its dimension in the direction indicated by the arrows 326 in FIG. 3A. Wicking redirects the solder, thus aligning the one or more solder balls and corresponding pads on which the solder balls are attached, leading to a reliable electrical connection formation. Cooling the joint below the austenite phase transformation temperature causes the shape memory structure (in the case of a two-way shape memory alloy) to revert to its Martensite phase (elastic-plastic behavior) which allows compression of the shape memory structure as the second die package (e.g., a memory, such as a dynamic random access memory (DRAM)) is pressed on the first die package (e.g., system on a chip (SoC)).

In one or more embodiments, a compressed or otherwise retracted shape memory structure in martensite phase can be attached (e.g., on selected solder balls or pads) at locations with known electrical connection failure issues. After the through mold holes are formed in the mold material, this shape memory structure-on-ball attachment can be achieved using localized laser heating on a few joints and aligning shape memory structure into soft, not molten, solder.

During the second die package attachment phase, the higher reflow temperature can cause the shape memory structure to go into austenite phase, thus stretching to some programmed form. The stretched dimension of the shape memory structure at austenite phase can be chosen such that it covers sufficient distance between the bumps to allow wicking of solder and enable reliable electrical connections. As the stretched spring touches the top molten solder, solder wicks down the shape memory structure forming an electrical connection. Such a solution can accommodate a wide range of package form factors and warpage shapes.

In one or more embodiments, a compressed shape memory structure in martensite phase is attached directly on the conductive pad attached to the first die package instead of a solder bump. During a second die package attachment phase, at the reflow temperature the spring will go into austenite phase stretching to its programmed form. The stretched dimension of the shape memory structure at austenite phase can be chosen such that it covers sufficient distance between the solder bump of the second die package and the conductive pad attached to the first die package to allow wicking of solder along the spring and enable reliable electrical connections. As the stretched shape memory structure touches the top molten solder, solder wicks below forming a joint. This solution may have one or more advantages over embodiments in which the shape memory structure is attached to a solder ball as TMI bump pitch nears about 0.4 millimeters or less and/or connection joints include a diameters of about seven millimeters or less.

Figure 8:
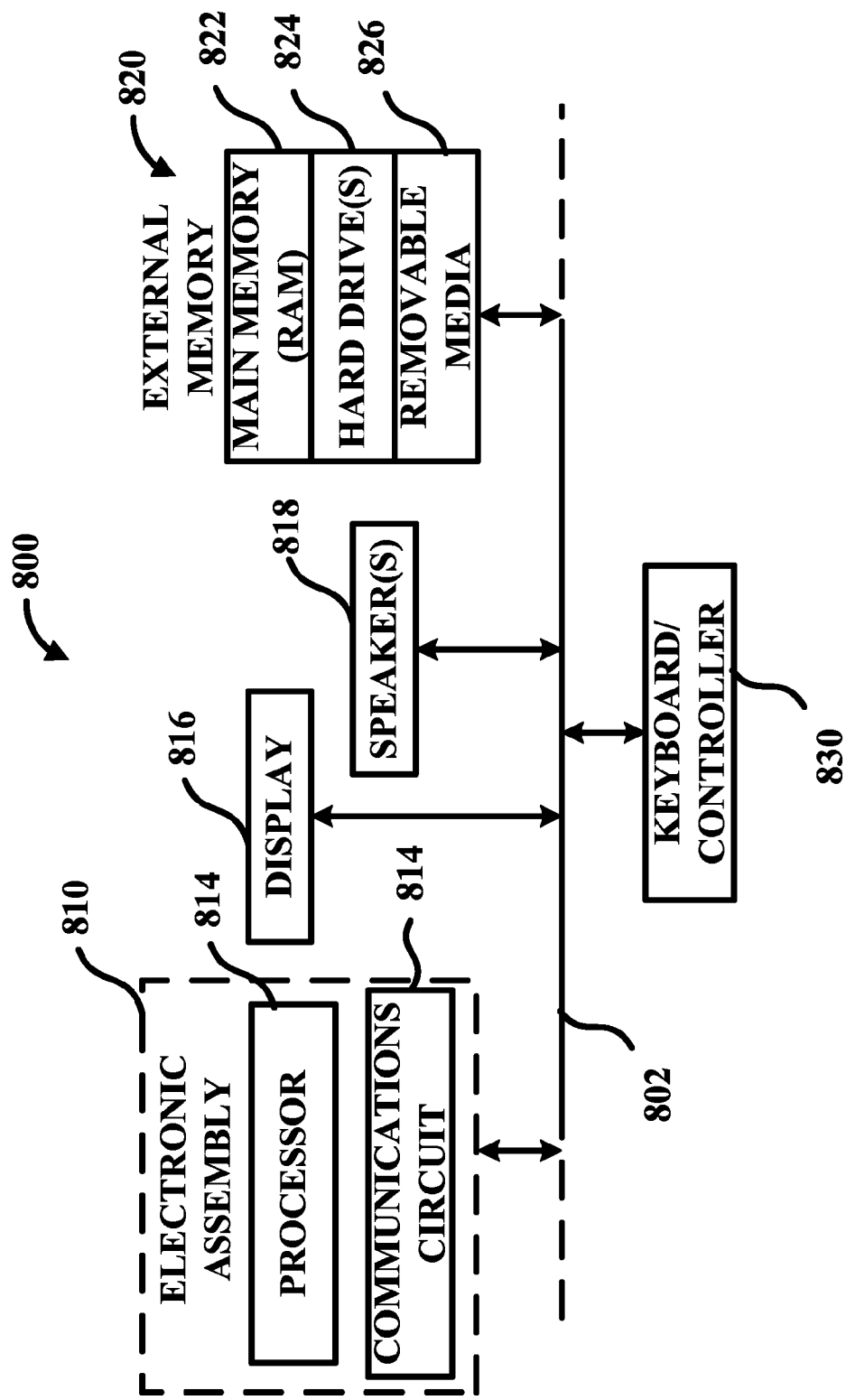
FIG. 8 shows a block diagram example of an electronic device which can include an electrical connection between packages using a shape memory structure as disclosed herein.

FIG. 8 shows a block diagram example of an electronic device which can include an electrical connection between packages using a shape memory structure as disclosed herein. An example of an electronic device using one or more packages with a shape memory structure aided PoP TMI electrical connection is included to show an example of a device application for the present disclosure. FIG. 8 shows an example of an electronic device 800 incorporating a shape memory structure aided PoP TMI electrical connection. Electronic device 800 is merely one example of a device in which embodiments of the present disclosure can be used. Examples of electronic devices 800 include, but are not limited to, personal computers, tablet computers, supercomputers, servers, telecommunications switches, routers, mobile telephones, personal data assistants, MP3 or other digital music players, radios, etc. In this example, electronic device 800 comprises a data processing system that includes a system bus 802 to couple the various components of the system. System bus 802 provides communications links among the various components of the electronic device 800 and can be implemented as a single bus, as a combination of busses, or in any other suitable manner.

An electronic assembly 810 is coupled to system bus 802. The electronic assembly 810 can include a circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 810 are a custom circuit, an application-specific integrated circuit (ASIC), or the like, such as, for example, one or more circuits (such as a communications circuit 814) for use in wireless devices like mobile telephones, pagers, personal data assistants, portable computers, two-way radios, and similar electronic systems. The IC can perform any other type of function.

The electronic device 800 can include an external memory 820, which in turn can include one or more memory elements suitable to the particular application, such as a main memory 822 in the form of random access memory (RAM), one or more hard drives 824, and/or one or more drives that handle removable media 826 such as compact disks (CD), digital video disk (DVD), and the like.

The electronic device 800 can also include a display device 816, one or more speakers 818, and a keyboard and/or controller 830, which can include a mouse, trackball, touch screen, voice-recognition device, or any other device that permits a system user to input information into and receive information from the electronic device 800.

ADDITIONAL NOTES AND EXAMPLES

In Example 1 a device can include a first die package including a first conductive pad on or at least partially in the first die package, a dielectric mold material on the first die package, the mold material including a hole therethrough at least partially exposing the pad, a second die package including a second conductive pad on or at least partially in the second die package the second die package on the mold material such that the second conductive pad faces the first conductive pad through the hole, and a shape memory structure in the hole and forming a portion of a solder column electrical connection between the first die package and the second die package.

In Example 2, the device of Example 1 includes, wherein the shape memory structure includes a spring that is configured to expand in austenite phase.

In Example 3, the device of Example 2 includes, wherein the shape memory structure is a two-way shape memory structure that is configured to lengthen towards the second die package when sufficiently heated and retract away from the second die package when sufficiently cooled.

In Example 4, the device of at least one of Examples 1-2 includes, wherein the solder column includes solder from a first solder ball and solder from a second solder ball and wherein the first solder ball is attached to the first conductive pad and the second solder ball is attached to the second conductive pad, wherein the shape memory structure is attached to the first solder ball and wherein the shape memory structure is configured to expand to the second solder ball and wick the solder from the first and second solder balls together when sufficiently heated.

In Example 5, the device of at least one of Examples 1-4 includes, wherein the shape memory structure is attached to the first conductive pad by a conductive adhesive, and wherein the solder column includes solder from a second solder ball attached to the second conductive pad, and wherein the shape memory structure is configured to expand to contact the second solder ball and wick solder from the second solder ball to the first conductive pad to form the solder column.

In Example 6, the device of at least one of Examples 1-5 includes, wherein the first die package includes a plurality of first conductive pads on or at least partially in the first die package, wherein the mold material includes a plurality of holes therethrough to at least partially expose each of the plurality of first conductive pads, wherein the solder column is one of a plurality of solder columns, each solder column in a respective hole of the plurality holes, each solder column including solder from a second solder ball, wherein the second die package includes a second plurality of conductive pads on or at least partially in the second die package and the plurality of solder balls attached to a respective second conductive pad of the plurality of second conductive pads, each solder ball situated at least partially in a hole of the plurality of holes, and wherein the shape memory structure is one of a plurality of shape memory structures in respective holes of the plurality holes, each of the shape memory structures located at areas of the first die package or the second die package known to warp.

In Example 7, the device of Example 6 includes, wherein each solder column further includes solder from a first solder ball of a plurality of first solder balls and a shape memory structure of the plurality of shape memory structures, the plurality of first solder balls attached to a respective first conductive pad of the plurality of first conductive pads, and each shape memory structure is attached to a respective first solder ball of the plurality of first solder balls.

In Example 8, the device of Example 6 includes, wherein each solder column further includes a shape memory structure of the plurality of shape memory structures, and each shape memory structure is attached by a conductive adhesive to a respective first conductive pad of the plurality of first conductive pads.

In Example 9 a method can include heating a first solder ball on a first conductive pad attached to a first die package to soften the first solder ball, situating a shape memory structure at least partially into the softened solder ball, situating a second die package over the first die package to situate a second solder ball attached to a second conductive pad attached to the second die package near the first solder ball, and reflowing the first and second solder balls together to form a solder column connected to the first and second conductive pads, the solder column including the shape memory structure at least partially embedded therein.

In Example 10, the method of Example 9 includes wherein the shape memory structure includes a spring shape.

In Example 11, the method of Example 10 includes, wherein the shape memory structure is a two-way shape memory structure that is configured to lengthen towards the second die package when sufficiently heated and retract away from the second die package when sufficiently cooled.

In Example 12, the method of Example 11 includes cooling the shape memory structure to cause the shape memory structure to retract.

In Example 13, the method of Example 12 includes pressing the second die package into a mold material between the first die package and the second die package while cooling the shape memory structure.

In Example 14, the method of Example 13 includes situating the mold material over the first solder ball and the first die package, and removing a portion of the mold material to create a through mold hole that exposes the first solder ball and at least a portion of the first conductive pad, prior to heating the first solder ball.

In Example 15, a method can include attaching, using a conductive adhesive, a shape memory structure on a first conductive pad attached to a first die package, situating a second die package over the first die package to situate a solder ball attached to a second conductive pad attached to the second die package near the shape memory structure, and reflowing the solder ball to form a solder column connected to the first and second conductive pads, the solder column including the shape memory structure at least partially embedded therein.

In Example 16, the method of Example 15 includes, wherein the shape memory structure includes a spring shape.

In Example 17, the method of Example 16 includes, wherein the shape memory structure is a two-way shape memory structure that is configured to lengthen towards the second die package when sufficiently heated and retract away from the second die package when sufficiently cooled.

In Example 18, the method of Example 17 includes cooling the shape memory structure to cause the shape memory structure to retract.

In Example 19, the method of Example 18 includes pressing the second die package into a mold material between the first die package and the second die package while cooling the shape memory structure.

In Example 20, the method of Example 19 includes situating the mold material over the shape memory structure and the first die package, and removing a portion of the mold material to create a through mold hole that exposes the shape memory structure and at least a portion of the first conductive pad, prior to attaching the shape memory material to the first conductive pad.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
   a first die package including a first conductive pad on or at least partially in the first die package;
   a dielectric mold material on the first die package, the mold material including a hole therethrough, the hole at least partially exposing the first conductive pad;
   a second die package including a second conductive pad on or at least partially in the second die package, the second die package on the mold material such that the second conductive pad faces the first conductive pad through the hole; and
   a shape memory structure in the hole and forming a portion of a solder column electrical connection between the first die package and the second die package, the shape memory structure formed of a shape memory alloy material that, when heated above an austenite temperature, reverts to a programmed shape.

2. The device of claim 1, wherein the shape memory structure includes a spring that is configured to expand in austenite phase, the shape memory alloy material that includes two or more of nickel, titanium, silver, cadmium, copper, aluminum, tin, iron, zinc, silicon, platinum, manganese, cobalt gallium, niobium, hafnium, and palladium.

3. The device of claim 2, wherein the shape memory structure is a two-way shape memory structure that is configured to lengthen towards the second die package to a first programmed shape when sufficiently heated and retract away from the second die package to a second, different programmed shape when sufficiently cooled.

4. The device of claim 1, wherein the solder column includes solder from a first solder ball and solder from a second solder ball and wherein the shape memory structure is suspended in the solder column.

5. The device of claim 1, wherein the shape memory structure is attached to the first conductive pad by a conductive adhesive, and wherein the solder column includes solder from only a single solder ball.

6. The device of claim 1, wherein:
   the first die package includes a plurality of first conductive pads on or at least partially in the first die package;
   the mold material includes a plurality of holes therethrough to at least partially expose each of the plurality of first conductive pads;
   the solder column is one of a plurality of solder columns, each solder column in a respective hole of the plurality holes, each solder column including solder from a respective second solder ball of a plurality of second solder balls;
   the second die package includes a second plurality of conductive pads on or at least partially in the second die package; and
   the shape memory structure is one of a plurality of shape memory structures in respective holes of the plurality holes.

7. The device of claim 6, wherein:
   each solder column further includes solder from a first solder ball of a plurality of first solder balls and a shape memory structure of the plurality of shape memory structures.

8. The device of claim 6, wherein:
   each solder column further includes a shape memory structure of the plurality of shape memory structures and conductive adhesive.

9. A method comprising:
   heating a first solder ball on a first conductive pad attached to a first die package to soften the first solder ball;
   situating a shape memory structure at least partially into the softened solder ball, the shape memory structure formed of a shape memory alloy material that, when sufficiently heated, reverts to a programmed shape;

situating a second die package over the first die package to situate a second solder ball attached to a second conductive pad of attached to the second die package near the first solder ball; and reflowing the first and second solder balls together to form a solder column connected to the first and second conductive pads, the solder column including the shape memory structure at least partially embedded therein.

10. The method of claim 9, wherein the shape memory structure includes a spring shape, the shape memory alloy material including two or more of nickel, titanium, silver, cadmium, copper, aluminum, tin, iron, zinc, silicon, platinum, manganese, cobalt, gallium, niobium, hafnium, and palladium.

11. The method of claim 10, wherein the shape memory structure is a two-way shape memory structure that is configured to lengthen towards the second die package to a first programmed shape when sufficiently heated and retract away from the second die package and revert to a second, different programmed shape when sufficiently cooled.

12. The method of claim 11, further comprising cooling the shape memory structure to cause the shape memory structure to retract and revert to the second programmed shape.

13. The method of claim 12, further comprising pressing the second die package into a dielectric mold material between the first die package and the second die package while cooling the shape memory structure.

14. The method of claim 13, further comprising:

situating the mold material over the first solder ball and the first die package; and removing a portion of the mold material to create a through mold hole that exposes the first solder ball and at least a portion of the first conductive pad, prior to heating the first solder ball.

15. A method comprising:

attaching, using a conductive adhesive, a shape memory structure on a first conductive pad attached to a first die package shape memory structure formed of a shape memory alloy material that, when sufficiently heated, reverts to a programmed shape;

situating a second die package over the first die package to situate a solder ball attached to a second conductive pad attached to the second die package near the shape memory structure; and reflowing the solder ball to form a solder column connected to the first and second conductive pads, the solder column including the shape memory structure at least partially embedded therein.

16. The method of claim 15, wherein the shape memory structure includes a spring shape, the shape memory alloy material including two or more of nickel, titanium, silver, cadmium, copper, aluminum, tin, iron, zinc, silicon, platinum, manganese, cobalt, gallium, niobium, hafnium, and palladium.

17. The method of claim 16, wherein the shape memory structure is a two-way shape memory structure that is configured to lengthen towards the second die package to a first programmed shape when sufficiently heated and retract away from the second die package and revert to a second, different programmed shape when sufficiently cooled.

18. The method of claim 17, further comprising cooling the shape memory structure to cause the shape memory structure to retract and revert to the second programmed shape.

19. The method of claim 18, further comprising pressing the second die package into a mold material between the first die package and the second die package while cooling the shape memory structure.

20. The method of claim 19, further comprising:

situating the mold material over the shape memory structure and the first die package; and removing a portion of the mold material to create a through mold hole that exposes the shape memory structure and at least a portion of the first conductive pad, prior to attaching the shape memory material to the first conductive pad.

* * * * *

UNITED STATES PATENT AND TRADEMARK OFFICE
CERTIFICATE OF CORRECTION

PATENT NO. : 9,659,908 B1
APPLICATION NO. : 14/937022
DATED : May 23, 2017
INVENTOR(S) : Sahasrabudhe et al.

Page 1 of 1

It is certified that error appears in the above-identified patent and that said Letters Patent is hereby corrected as shown below:

On the Title Page

In item (22), in "Filed", in Column 1, Line 1, after "Nov. 10. 2015", insert
--¶(65) Prior Publication Data
US 2017/0133350 A1 May 11, 2017--

In the Claims

In Column 12, Line 21, in Claim 2, delete "cobalt" and insert --cobalt,-- therefor In Column 13, Line 5, in Claim 9, after "pad", delete "of"

In Column 14, Line 1, in Claim 15, delete "package" and insert --package, the-- therefor Signed and Sealed this
Fifth Day of May, 2020

Andrei Iancu
*Director of the United States Patent and Trademark Office*